US010985755B2

(12) United States Patent
Lark, Jr.

(10) Patent No.: US 10,985,755 B2
(45) Date of Patent: *Apr. 20, 2021

(54) INTELLIGENT LIGHTING CONTROL SYSTEM PRE-MOUNT CHASSIS APPARATUSES, SYSTEMS, AND METHODS

(71) Applicant: Racepoint Energy, LLC, Osterville, MA (US)

(72) Inventor: William Lark, Jr., Glendale, CA (US)

(73) Assignee: Racepoint Energy, LLC, Osterville, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/316,405

(22) PCT Filed: Jul. 7, 2017

(86) PCT No.: PCT/US2017/041193
§ 371 (c)(1),
(2) Date: Jan. 9, 2019

(87) PCT Pub. No.: WO2018/013428
PCT Pub. Date: Jan. 18, 2018

(65) Prior Publication Data
US 2019/0296535 A1  Sep. 26, 2019

Related U.S. Application Data

(60) Provisional application No. 62/360,319, filed on Jul. 9, 2016.

(51) Int. Cl.
*H02G 3/14* (2006.01)
*H03K 17/96* (2006.01)
(Continued)

(52) U.S. Cl.
CPC ............ *H03K 17/96* (2013.01); *F21V 15/01* (2013.01); *F21V 17/10* (2013.01); *H02G 3/18* (2013.01);
(Continued)

(58) Field of Classification Search
CPC ...... H03K 17/96; H05B 47/175; H05B 47/19; H05B 41/36; H02G 3/18; F21V 17/10; F21V 15/01; Y02B 20/48
See application file for complete search history.

(56) References Cited

U.S. PATENT DOCUMENTS 4,721,476 A * 1/1988 Zeliff ..................... H02G 3/185
174/489
5,026,300 A * 6/1991 Varner ............... H01R 13/6395
439/371

(Continued)

FOREIGN PATENT DOCUMENTS

WO    WO-2014015646 A1    1/2014

OTHER PUBLICATIONS

PCT Notification of Transmittal of the International Search Report and the Written Opinion of the International Searching Authority, or the Declaration, International Searching Authority, International Application No. PCT/US17/41193, dated Sep. 13, 2017, 13 pages.

*Primary Examiner* — Truc T Nguyen
(74) *Attorney, Agent, or Firm* — Cesari and McKenna, LLP

(57) ABSTRACT

The present disclosure provides an intelligent lighting control system include a pre-mount chassis system. The methods include attaching a chassis to an electrical wall box, the chassis comprising at least one hook extending in an upward direction and at least one opening, the at least one hook positioned along a peripheral portion of the at least one (Continued)

opening. The methods include hanging a base module from the at least one hook in the chassis.

13 Claims, 13 Drawing Sheets

(51) Int. Cl.
*F21V 15/01* (2006.01)
*F21V 17/10* (2006.01)
*H02G 3/18* (2006.01)
*H05B 41/36* (2006.01)
*H05B 47/19* (2020.01)
*H05B 47/175* (2020.01)

(52) U.S. Cl.
CPC ............ *H05B 41/36* (2013.01); *H05B 47/175* (2020.01); *H05B 47/19* (2020.01); *Y02B 20/40* (2013.01)

(56) References Cited

U.S. PATENT DOCUMENTS

| | | | |
|---|---|---|---|
| 5,338,910 A | 8/1994 | Tsai | |
| 5,442,132 A * | 8/1995 | Sandell | F21V 21/02 174/54 |
| 5,955,702 A * | 9/1999 | Grossman | H02G 3/14 174/66 |
| 6,101,731 A * | 8/2000 | Mesa | H02G 3/12 33/528 |
| 6,133,843 A * | 10/2000 | Davidson | G08B 7/062 174/481 |
| 7,034,225 B2 * | 4/2006 | Thompson | H01K 1/62 174/66 |
| 7,456,357 B1 * | 11/2008 | Kwong | B60R 21/235 174/135 |
| 7,818,906 B2 | 10/2010 | Hansen et al. | |
| 9,301,410 B2 | 3/2016 | Rohmer | |
| 9,322,533 B1 * | 4/2016 | Pearson | F21S 8/036 |
| 9,394,919 B1 * | 7/2016 | Byrne | F04D 29/646 |
| 9,401,252 B2 | 7/2016 | Keirstead | |
| 9,620,945 B2 | 4/2017 | Rohmer | |
| 9,839,099 B2 | 12/2017 | Lark, Jr. | |
| 10,249,455 B2 | 4/2019 | Lange | |
| 10,270,235 B2 | 4/2019 | Rohmer | |
| 2003/0014939 A1 * | 1/2003 | DeWall | H02G 3/086 52/741.1 |
| 2003/0021104 A1 | 1/2003 | Tsao | |
| 2003/0147749 A1 * | 8/2003 | Kerr, Jr. | F04D 29/601 416/5 |
| 2003/0150637 A1 * | 8/2003 | Hieda | B60R 16/0238 174/66 |
| 2007/0115654 A1 * | 5/2007 | Ruben | F21S 8/06 362/221 |
| 2007/0131827 A1 * | 6/2007 | Nevers | F21V 21/04 248/201 |
| 2011/0303433 A1 * | 12/2011 | Wagner | H02G 3/14 174/66 |
| 2012/0012383 A1 * | 1/2012 | Lin | H02S 40/34 174/520 |
| 2012/0044704 A1 * | 2/2012 | Wilson | F21V 23/026 362/365 |
| 2012/0181054 A1 * | 7/2012 | Melton | H02G 3/083 174/50 |
| 2012/0206100 A1 * | 8/2012 | Brown | B60L 3/0069 320/109 |
| 2013/0252444 A1 * | 9/2013 | Keswani | H01R 12/7088 439/76.1 |
| 2014/0027143 A1 | 1/2014 | Hunter | |
| 2014/0043835 A1 * | 2/2014 | Storm | F21S 8/06 362/404 |
| 2014/0224792 A1 | 8/2014 | Beneke | |
| 2014/0268825 A1 * | 9/2014 | Lay | F21V 21/03 362/371 |
| 2014/0354126 A1 * | 12/2014 | DeLorean | A47B 51/00 312/236 |
| 2015/0318677 A1 * | 11/2015 | Witherbee | H02G 3/126 248/218.4 |
| 2017/0256927 A1 * | 9/2017 | Padilla | H02G 3/14 |
| 2018/0013428 A1 | 1/2018 | Lark, Jr. | |

\* cited by examiner

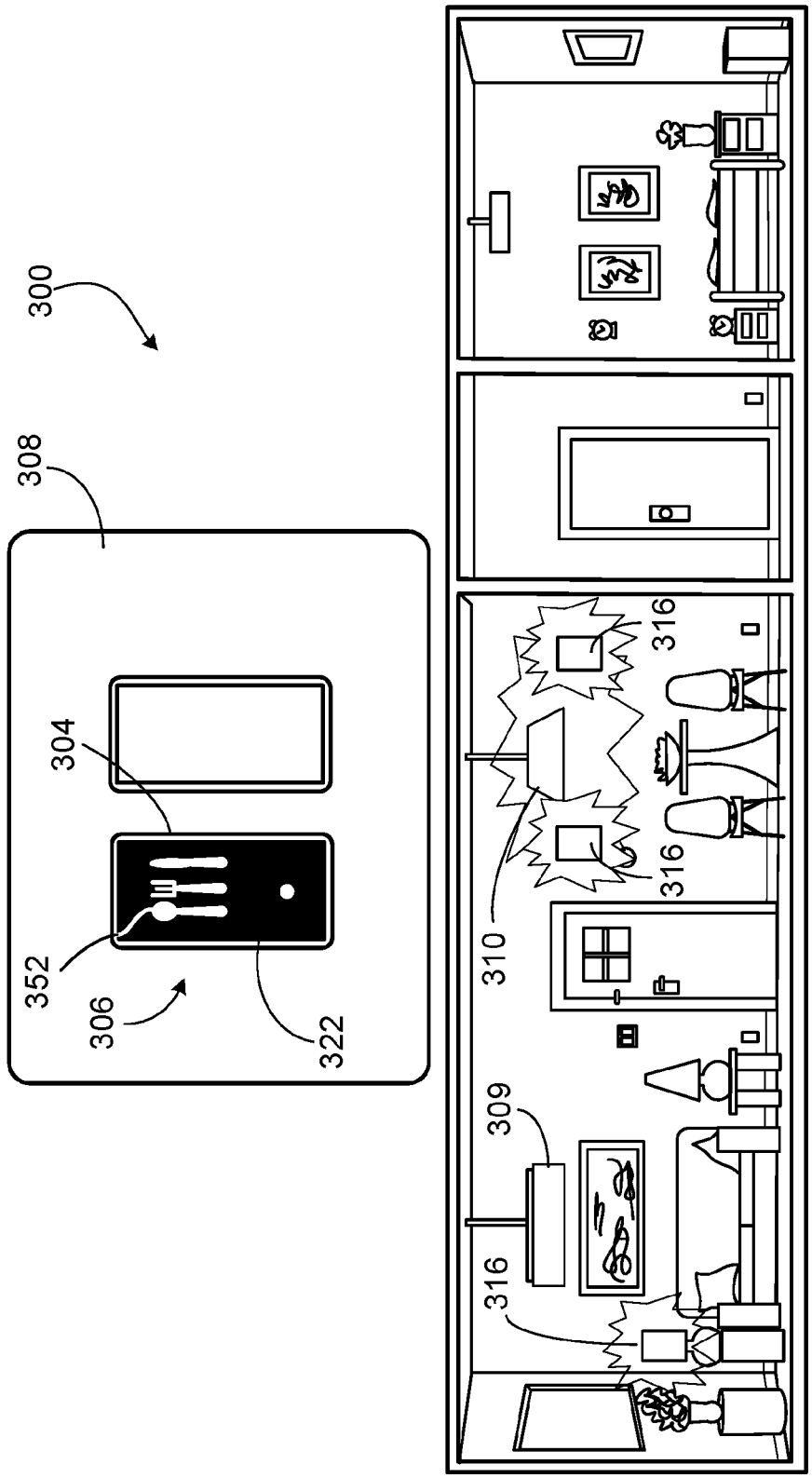

INTELLIGENT LIGHTING CONTROL SYSTEM PRE-MOUNT CHASSIS APPARATUSES, SYSTEMS, AND METHODS

RELATED APPLICATION

The present application is a National Stage of International Application No. PCT/US2017/041193 filed Jul. 7, 2017 entitled INTELLIGENT LIGHTING CONTROL SYSTEM PRE-MOUNT CHASSIS APPARATUSES, SYSTEMS AND METHODS, and claims priority to U.S. Provisional Patent Application No. 62/360,319, filed on Jul. 9, 2016, entitled "INTELLIGENT LIGHTING CONTROL SYSTEM PRE-MOUNT CHASSIS APPARATUSES, SYSTEMS, AND METHODS," which application is incorporated herein by reference in its entirety.

TECHNICAL FIELD

The present application relates generally to the field of lighting control systems.

BACKGROUND

Customizing and automating home lighting control devices is often epitomized by the installation of unsightly lighting switches that are inundated with light switches confusingly mapped to respective fixtures. Automated home lighting control systems can also include large, complex, expensive central hubs that require expert or skilled technicians for installation and/or operation. Smart light bulbs and/or Wi-Fi enabled lightbulbs introduced into any of these contexts or even in simpler ones can disadvantageously be limited by the light switch that it is associated with and/or the lighting fixture itself. For example, if a light switch associated with a smart light bulb is switched off the smart light bulb becomes inoperable.

SUMMARY

The inventors have appreciated that various embodiments disclosed herein provide apparatuses, systems, and methods for mounting intelligent lighting control system components.

Various embodiments provide a pre-mount system configured to be coupled to a wall box that permits base modules of a lighting control system to be snapped into place. Accordingly, once the chassis is connected this precludes the need for additional screws or tools to install the lighting control system components once chassis is installed to wall box. This allows for eased troubleshooting when wiring—allowing the installer to quickly access the wires if/when necessary. The chassis creates a true/flat surface for each of the bases modules be coupled thereto and therefore also to the switches. The spacing and alignment between each of the switches is tightly controlled by the chassis to prevent irregularities that are commonly found in many individual switch installations.

The chassis facilitates a vertical lock of the base modules once the wall plate is snapped in in place. While the slide-lock between the base modules and chassis creates a convenient and simple assembly and disassembly. Additionally, once the setup is complete, the bases [and their conjoined switches] are securely static. The wall plate, which snaps into chassis and surrounds the bases perimeter, creates a hard-stop to vertically constrain the bases to the chassis. Additionally dual use of slide-lock mechanism for temporary pre-mount and wire installation is afforded by the chassis pre-mount. For convenient connection to the home's wiring, the base modules can be temporarily hung from the chassis in an orientation that positions all the wires close together.

Various embodiments provide methods of installing a lighting control system. The methods include attaching a chassis to an electrical wall box, the chassis comprising at least one hook extending in an upward direction and at least one opening, the at least one hook positioned along a peripheral portion of the at least one opening. The methods include hanging a base module from the at least one hook in the chassis. The base modules include a base housing forming a well and including a first electrical connector positioned in the well. The first electrical connector is connected to a power circuit that is configured to receive current from an alternating current (A.C.) power supply and is configured for electrical coupling with a lighting circuit of a light fixture. The methods include coupling a plurality of base module wires extending from the base module to a plurality of electrical wall box wires extending from the electrical wall box contemporaneously with the base module hanging from the at least one hook, the wires configured to connect the A.C. power supply to the base module. The methods include removing the base module from the at least one hook after connecting the plurality of base module wires to the plurality of electrical wall box wires. The methods include nesting the base module into wall box such that well extends through the opening in the chassis and into the electrical wall box, wherein nesting further comprises engaging the at least one opening in the base module with the at least one hook. The base module is turned 180 degrees from the hanging position to the nesting position along an axis coplanar with a wall in which the electrical wall box is positioned.

In some implementations, hanging the base module from the hook includes hanging the base module below the opening in the chassis.

In some implementations, the hooks create a vertical slot for a slide-lock engagement with the hanging base module, the slide-lock engagement configured to prevent the hanging hook from tilting via parallel surfaces of the base module and chassis coplanar engagement with one another.

In some implementations, hanging the base module comprises hanging the base module from a pair of hooks.

In some implementations, the base module comprises at least four openings and the chassis comprises at least four hooks and wherein the base module is configured to hang from two openings positioned at a top portion of the chassis engaging two hooks positioned at a bottom portion of the chassis.

In some implementations, attaching comprising attaching the chassis to the electrical wall box via screws.

In some implementations, engaging the at least one opening in the base module with the at least one hook further comprises a snap fit engagement of the at least one opening in the base module with the at least one hook.

In some implementations, the at least one hook is configured for snap fit engagement with the at least one opening in the base module in the nested configuration and configured for a loos engagement with the at least one opening in the base module in the hanging configuration.

In some implementations, engaging the at least one opening in the base module with the at least one hook further comprises engaging the chassis without a screw fastener.

In some implementations, the method includes attaching a wall plate to the chassis over the base module, whereby the base module is positioned between the chassis and the wall plate.

In some implementations, the method includes nesting a light control module in the base module. The light control modules includes a module housing, a second electrical connector configured for engagement with and electrical coupling to the first electrical connector of a base module when nested, and a switch control circuit positioned in the housing and including a controller configured to modulate the flow of electrical energy to the lighting circuit via a dimmer circuit to produce a plurality of lighting scenes by varying the quantity of illumination of the light bulb, the switch control circuit electrically connected to the second electrical connector.

Various embodiments provide a chassis system according to any one of the preceding claims. In some implementations, the chassis is configured to hold a plurality of nested base modules in parallel with one another.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 3A-3F illustrate a lighting control device transitioning through various lighting settings and a room having lighting fixtures controlled by the lighting control device.

The features and advantages of the inventive subject matter disclosed herein will become more apparent from the detailed description set forth below when taken in conjunction with the drawings.

DETAILED DESCRIPTION

Following below are more detailed descriptions of various concepts related to, and exemplary embodiments of, inventive systems, methods and components of lighting control devices.

Figure 1A:
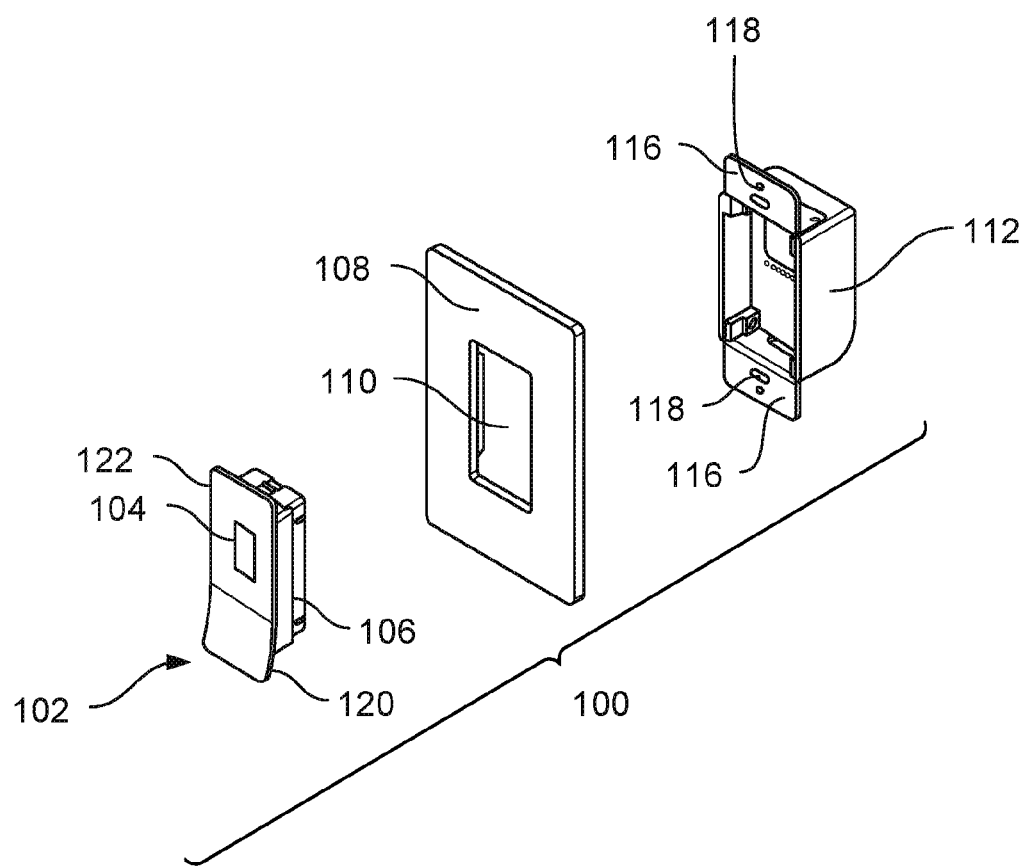
FIG. 1A is a perspective partially exploded view of a lighting control device.

FIG. 1A is a perspective partially exploded view of a lighting control device 100. The lighting control device 100 includes a switch module 102 including a light switch actuator 106 and a tactile display 104 housed in the light switch actuator 106. The lighting control device 100 also includes a wall-plate cover 108 including a switch module opening 110 extending therethrough. The lighting control device 100 also includes a base module 112 configured for coupling to the switch module 102 via multi-pin socket 114. The base module 112 is sized and configured for receipt within a one-gang wall electrical box and has a volume corresponding substantially thereto. The base module 112 is configured to be coupled to a wall electrical box via connection tabs 116 and fastener apertures 118 in the connection tabs 116.

The light switch actuator 106 includes an outer actuation surface 122, which as discussed further herein may be composed of glass. The actuation surface 122 is movable, for example, by pushing on the curved foot 120 to cause the light switch actuator 106 to pivot, for example. The pivoting of the light switch actuator 106 and the actuation surface 122 causes a contact component (shown in FIG. 2) of the switch actuator 106 to move from a first position to a second position. Movement of the contact component causes a connection of an electrical flow path, for example by allowing two electrical contacts to connect or by connecting the contact component with an electrical contact. The connecting of the electrical flow path, permits electrical energy supplied by a power source connected to the base module 112 to energize or activate the tactile display 104, as discussed in further detail herein. The tactile display 104 is structured in the switch module to move contemporaneously with at least a portion of the actuation surface 122 and with the actuator 106. When activated or energized, the tactile display 104 allows a user to define or select predefined lighting settings where the lighting settings change the voltage or power supplied to one or more light fixtures. The change in power supplied to the light fixtures may include a plurality of different voltages supplied to each fixture and may be based on various parameters including, but not limited to, location, light intensity, light color, type of bulb, type of light, ambient light levels, time of day, kind of activity, room temperature, noise level, energy costs, user proximity, user identity, or various other parameters which may be specified or detected. Furthermore, the lighting control device 100 may be connected to all of the lights in a room or even in a house and can be configured to operate cooperatively with one or more other lighting control devices 100 located in a unit or room and connected to the same or distinct lighting fixtures.

Figure 1B:
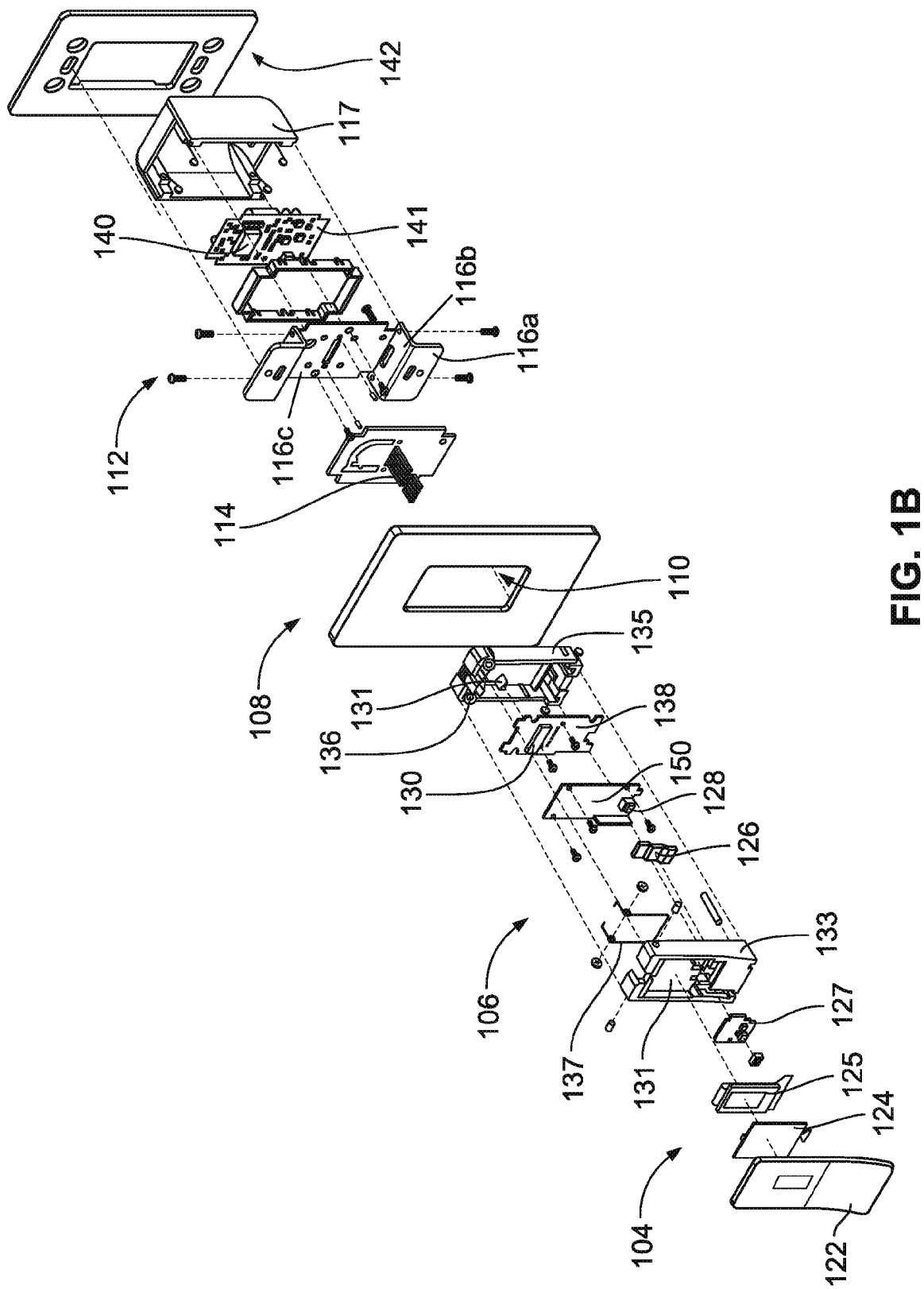
FIG. 1B is a fully exploded view of the lighting control device of FIG. 1A

FIG. 1B is a fully exploded view of the lighting control device 100 of FIG. 1A. As demonstrated in FIG. 1B, the tactile display 104 is positioned between the outer actuation surface 122 and the light switch actuator 106. The actuation surface 122 may be composed of an impact-resistant glass material permitting light from the tactile display 104 and/or a clear sight of path for sensors 127 or other lights, such as a light from light pipe 126 indicating activation to pass through the actuation surface 122. The tactile display 104 is composed of a polymer-based capacitive touch layer 124 and a light emitting diode panel 125, which are controlled via one or more modules or processors positioned on the printed circuit board 129. The tactile display 104 is housed within a recess 131 of the light switch actuator 106 beneath the actuation surface 122. The light switch actuator 106 may be formed as a thermoplastic housing including a housing cover 133 and a housing base 135. The light switch actuator housing cover 133 is pivotally connected to the housing base 135 via pins 136 and the housing cover 133 is biased with respect the housing base 135 via torsion spring 137. In particular embodiments, the light switch actuator housing cover 133 may be configured to slide or otherwise translate or rotate. The outer actuation surface 122 is biased with the switch actuator housing cover 133 and moves contemporaneously therewith in concert with the tactile display 104 housed in the cover component 133 of the light switch actuator 106. The light switch actuator 106 includes a switch pin 128 movable between positions to close an open circuit on the primary printed circuit board substrate 150, which board also houses a switch controller or processor. In certain embodiments the light switch actuator 106 may include a circuit board stack, including the primary printed circuit board substrate 150 and a secondary printed circuit board 138 The light switch actuator 106 may include a latch 136 for coupling to the base module 112 (e.g. as the light switch actuator 106 is passed through the opening 110 in the wall-plate cover 108), which latch causes the light switch actuator 106 to click into place. The housing base 135 includes a multi-pin connector or plug 134 configured to engage the multi-pin socket 114 of the base module 112.

The lighting control device 100 includes a mounting chassis 142 configured to be installed to an electrical wall box. The mounting chassis 142 creates an even surface for installation of the other modules (e.g., the base module 112 and the switch module 102). Once the base module is connected to the electrical wall box via the mounting chassis 142, the wall plate cover 108 can be coupled to the mounting chassis 142 and the light switch actuator 106 can be inserted through the switch module opening 110. In particular embodiments, the wall plate cover can be coupled to the mounting chassis 142 and/or the tabs 116 of the base module via magnets. The magnets may be recessed within openings of a portion of the wall plate cover 108. As noted, the base module 112 is configured to be coupled to the mounting chassis 142 via connection tabs 116. The base module 112 is further configured to be electrically coupled to a power source (e.g., an electrical wire coming from an electrical breaker box to the electrical wall box) and to one or more light fixtures wired to the electrical box. Accordingly, the base module 112 provides an interface between a power source, the light switch actuator 106, and one or more light fixtures. The base module includes a processor 140 and a circuit board 141 for managing the power supplied by the power source and routed to the one or more light fixtures in accordance with a light setting selection identified via the light switch actuator 106 or the tactile display 104.

One or more of the processor on the printed circuit board 15038a or 138b 130 and the base module processor 140 may include wireless links for communication with one or more remote electronic device such as a mobile phone, a tablet, a laptop, another mobile computing devices, one or more other lighting control devices 100 or other electronic devices operating in a location. In certain implementations the wireless links permit communication with one or more devices including, but not limited to smart light bulbs, thermostats, garage door openers, door locks, remote controls, televisions, security systems, security cameras, smoke detectors, video game consoles, robotic systems, or other communication enabled sensing and/or actuation devices or appliances. The wireless links may include BLUETOOTH classes, Wi-Fi, Bluetooth-low-energy, also known as BLE, 802.15.4, Worldwide Interoperability for Microwave Access (WiMAX), an infrared channel or satellite band. The wireless links may also include any cellular network standards used to communicate among mobile devices, including, but not limited to, standards that qualify as 1G, 2G, 3G, or 4G. The network standards may qualify as one or more generation of mobile telecommunication standards by fulfilling a specification or standards such as the specifications maintained by International Telecommunication Union. The 3G standards, for example, may correspond to the International Mobile Telecommunications-2000 (IMT-2000) specification, and the 4G standards may correspond to the International Mobile Telecommunications Advanced (IMT-Advanced) specification. Examples of cellular network standards include AMPS, GSM, GPRS, UMTS, LTE, LTE Advanced, Mobile WiMAX, and WiMAX-Advanced. Cellular network standards may use various channel access methods e.g. FDMA, TDMA, CDMA, or SDMA. In some embodiments, different types of data may be transmitted via different links and standards. In other embodiments, the same types of data may be transmitted via different links and standards.

Figure 2A:
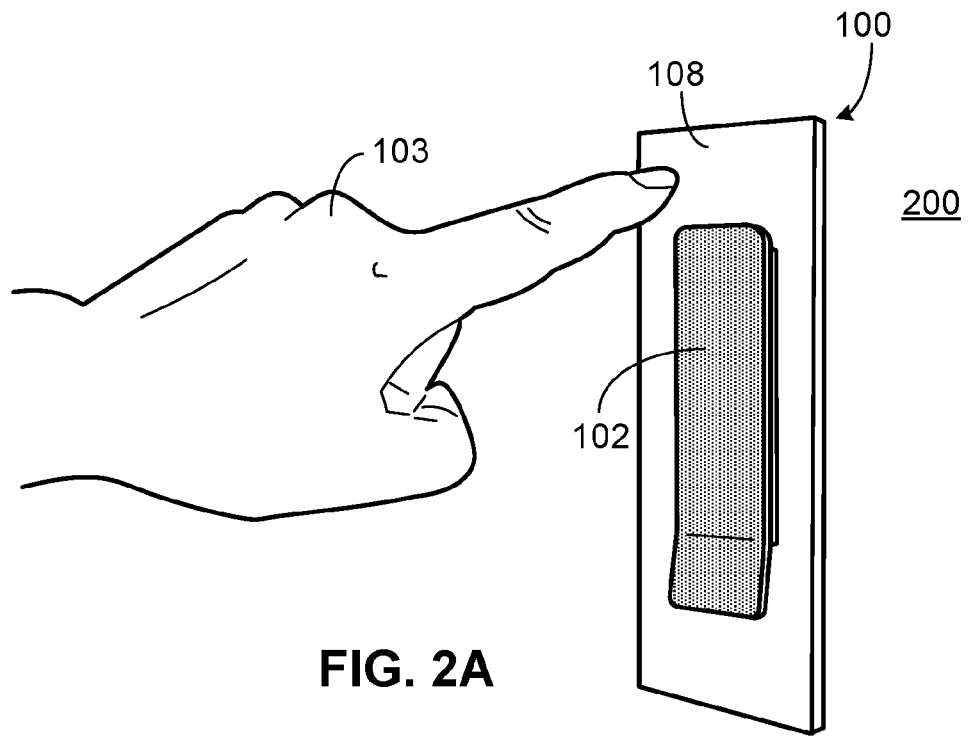
FIG. 2A shows the lighting control device of FIG. 1A mounted on a wall.

FIG. 2A shows the lighting control device 100 of FIG. 1A mounted on a wall 200. As demonstrated in FIG. 2A, the base module 112 is not visible upon installation of the lighting control device 100 in view of the wall-plate cover 108. Because the wall-plate cover 108 attaches to the base module 112, the wall-plate cover 108 appears to be floating on the wall 200. The lighting control device 100 may be activated by a user 103 interacting with the outer actuation surface 122 and the tactile display 104.

Figure 2B:
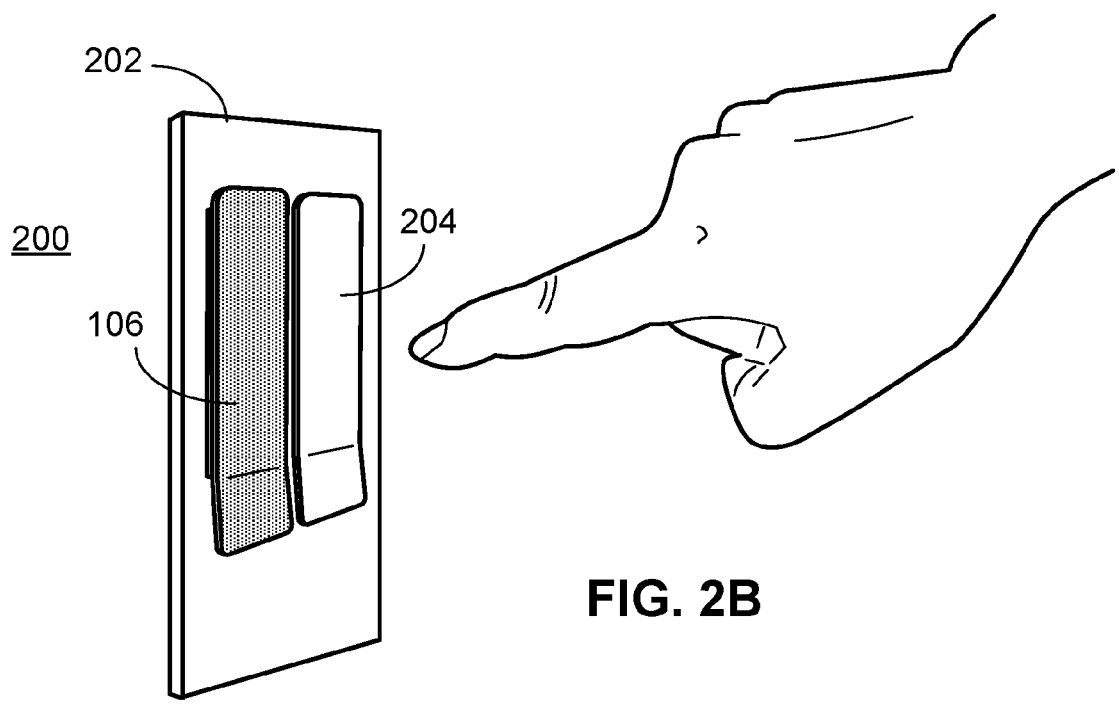
FIGS. 2B and 2C illustrate multi-switch lighting control devices.
Figure 2C:
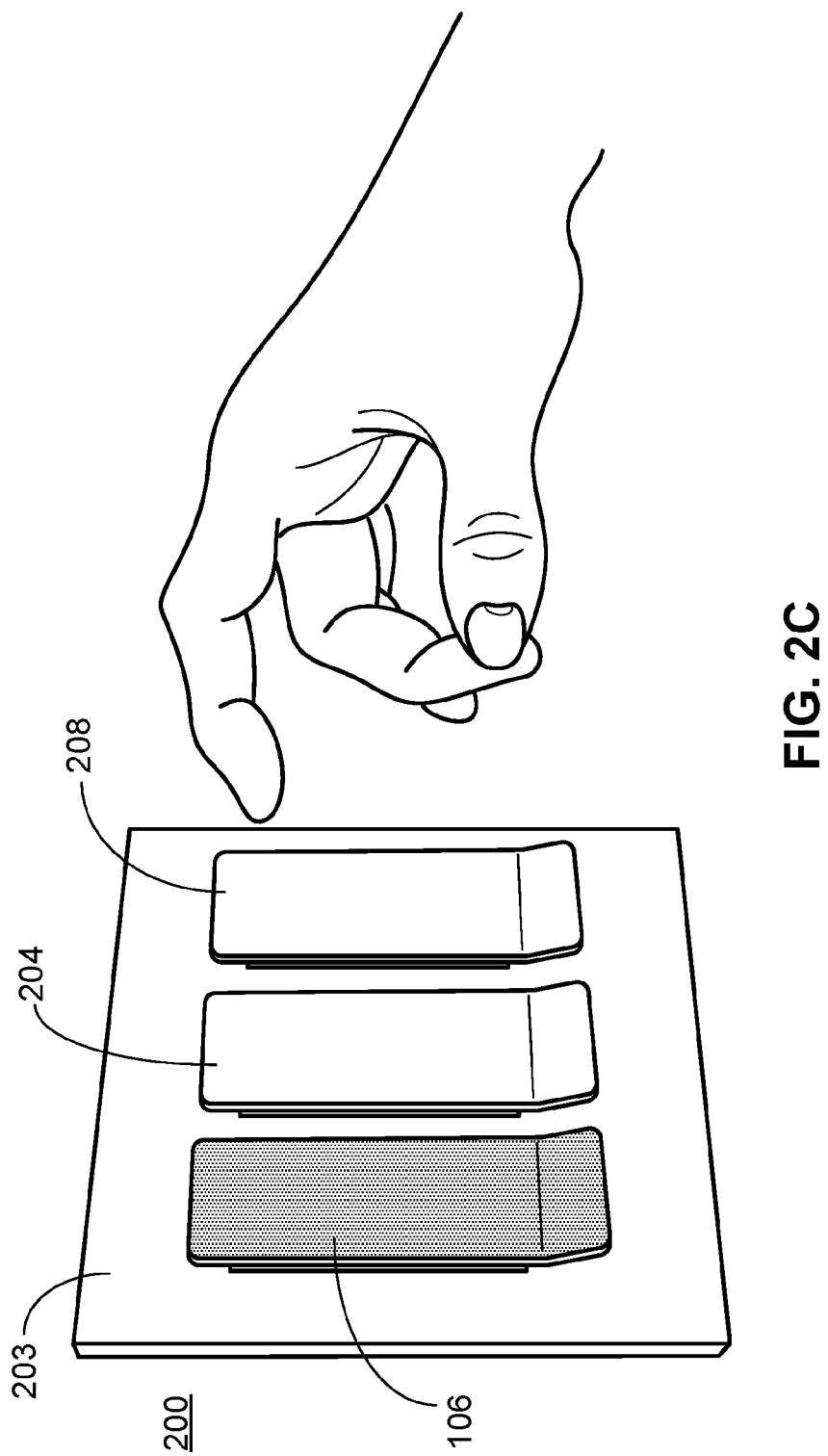

FIGS. 2B and 2C illustrate multi-switch configurations of multiple lighting control device. FIGS. 2B and 2C illustrate a two switch and three switch embodiment respectively where the lighting control devices 202 and 203 each include a light switch actuator 106 as well as auxiliary switches 204 and 208, as well as 2 and 3 base modules 112, respectively.

FIGS. 3A-3F illustrate a lighting control device transitioning through various lighting settings and a room having lighting fixtures controlled by the lighting control device.

Figure 3A:
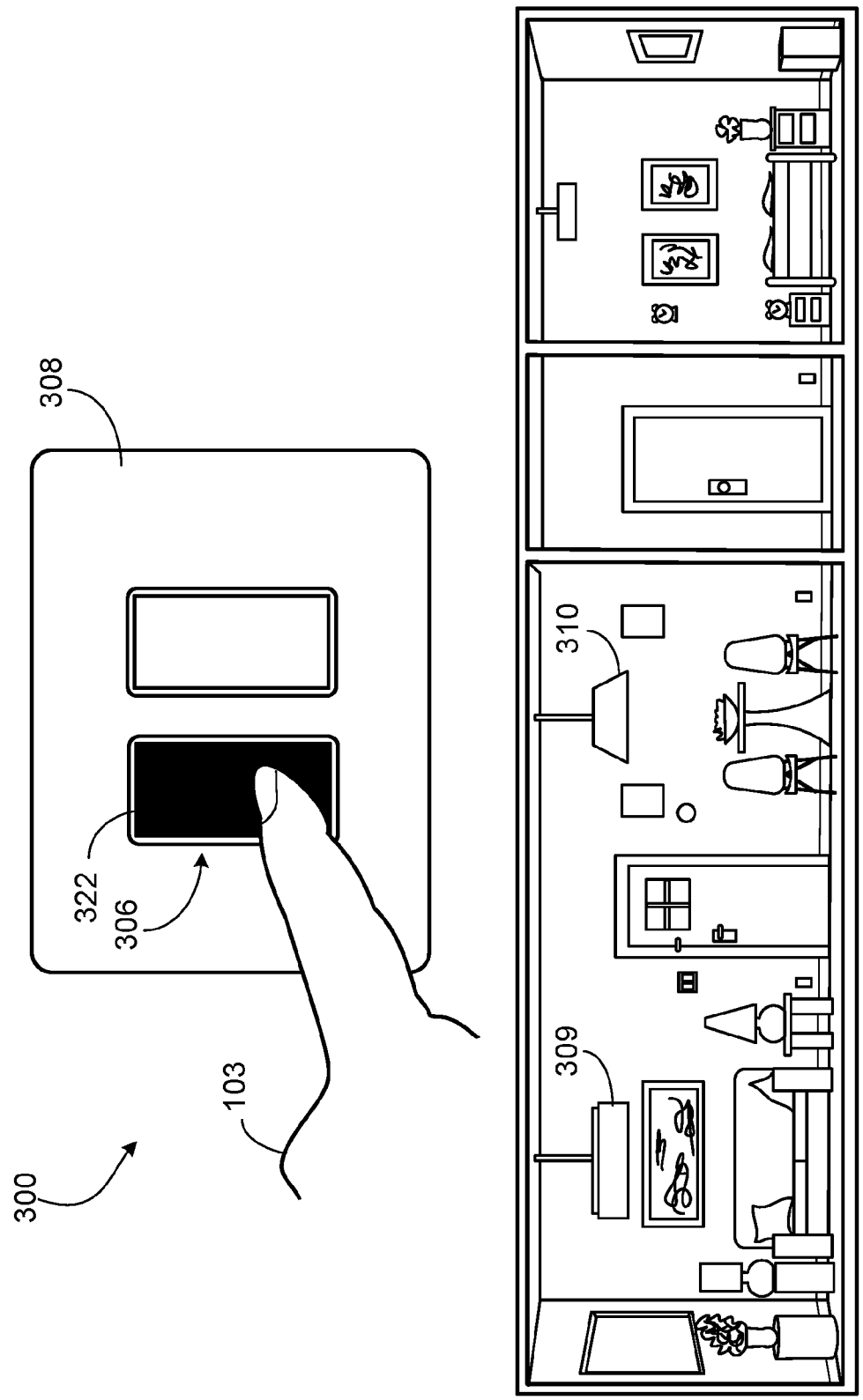
Figure 3B:
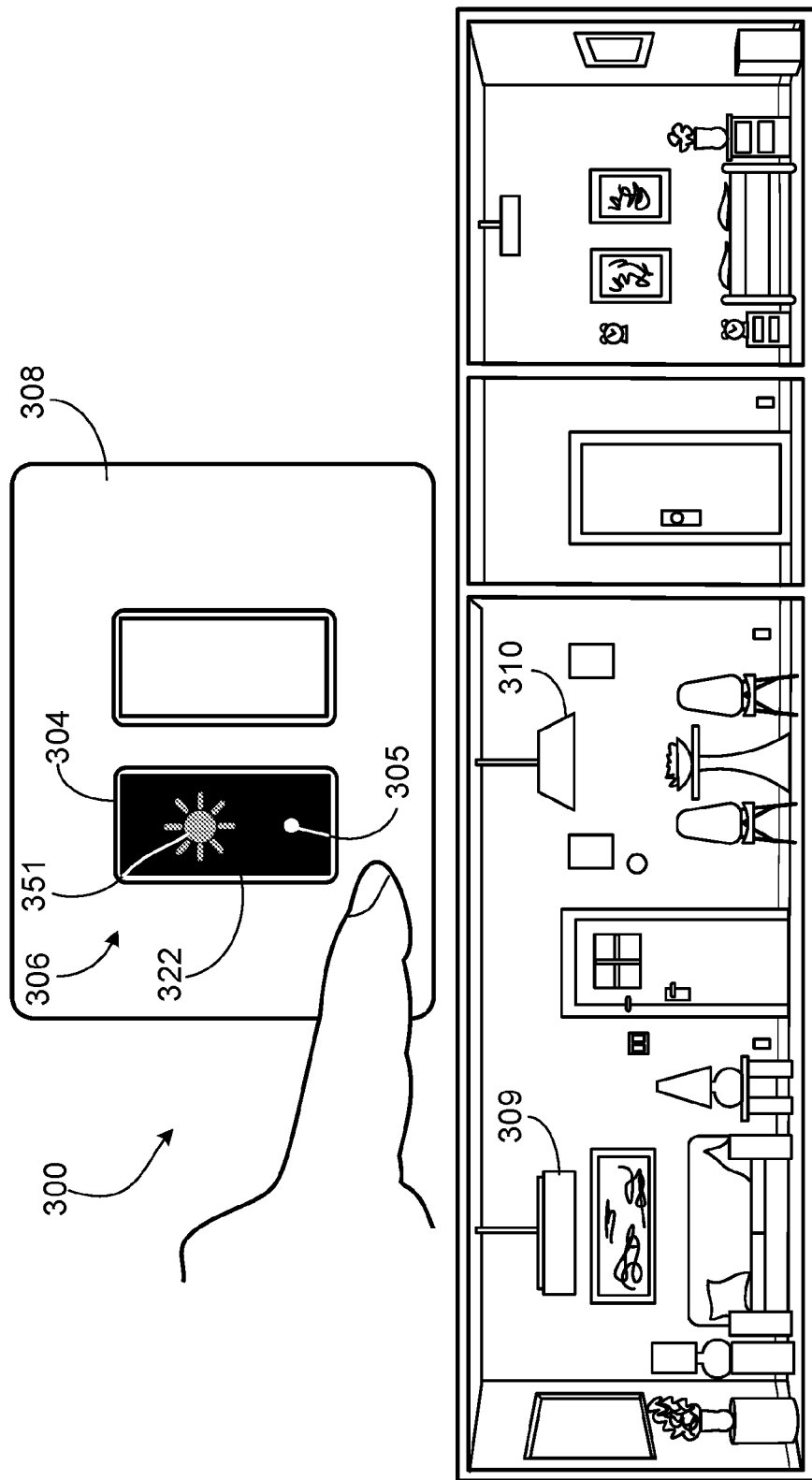
Figure 3C:
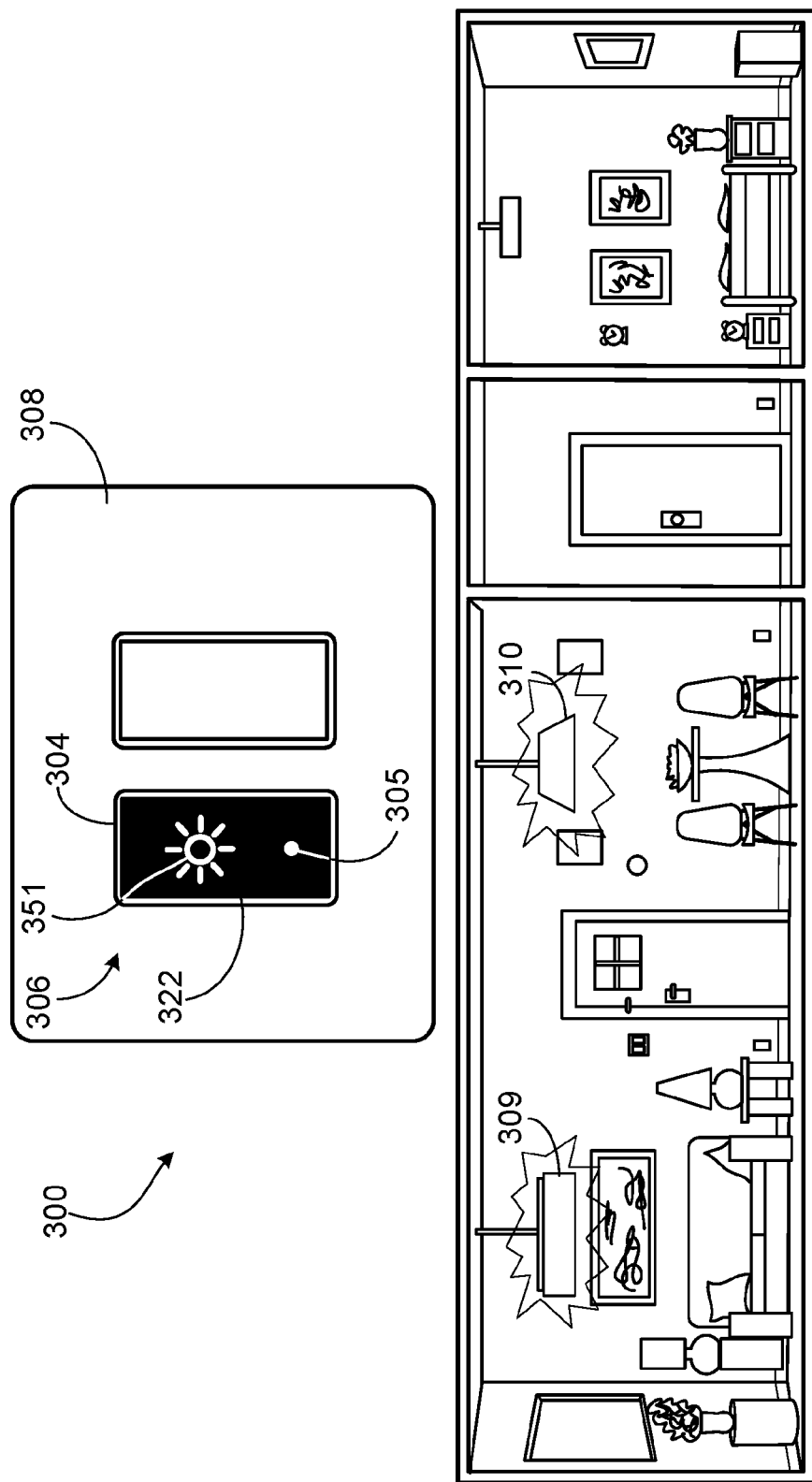
Figure 3D:
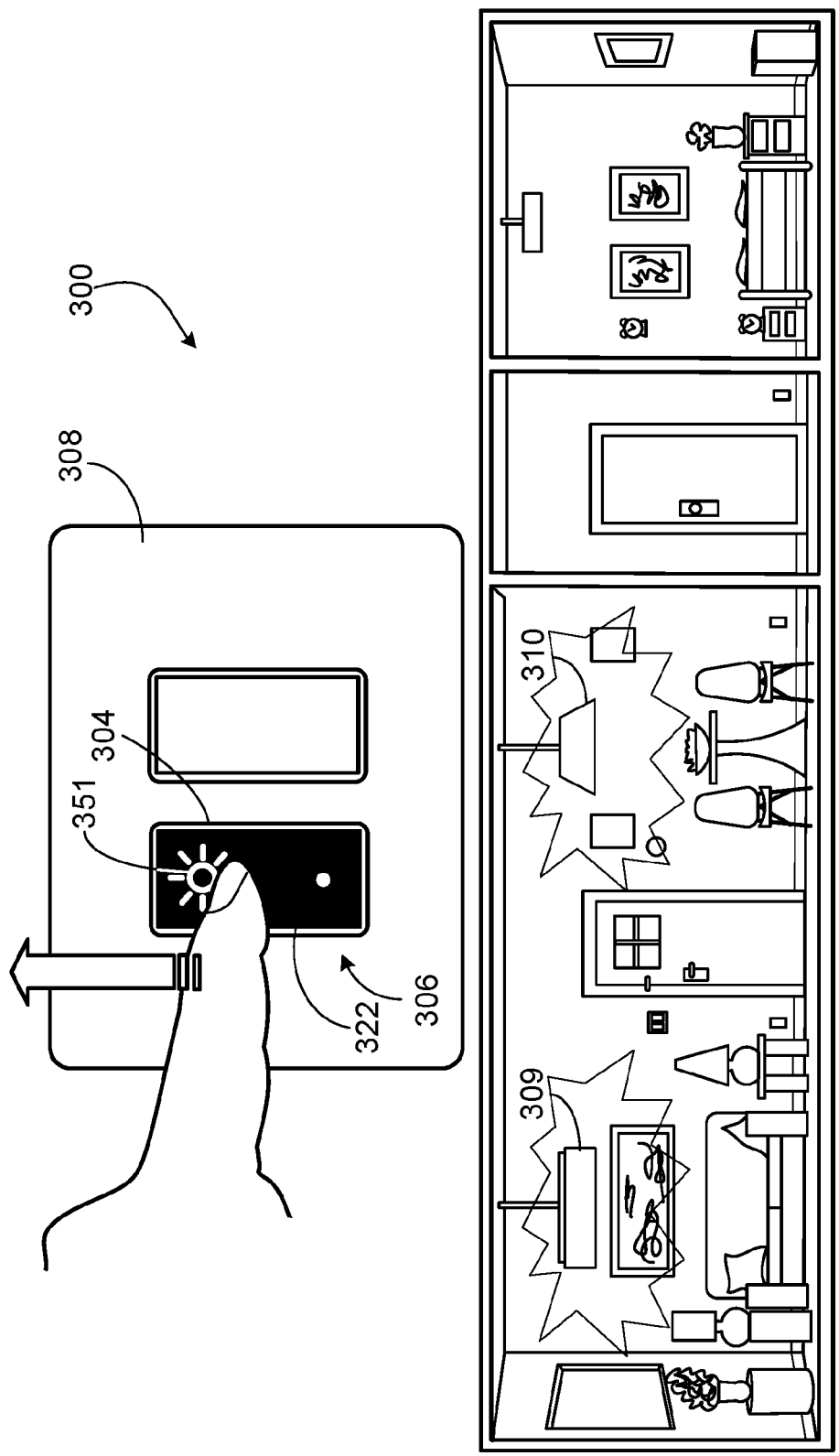
Figure 3F:
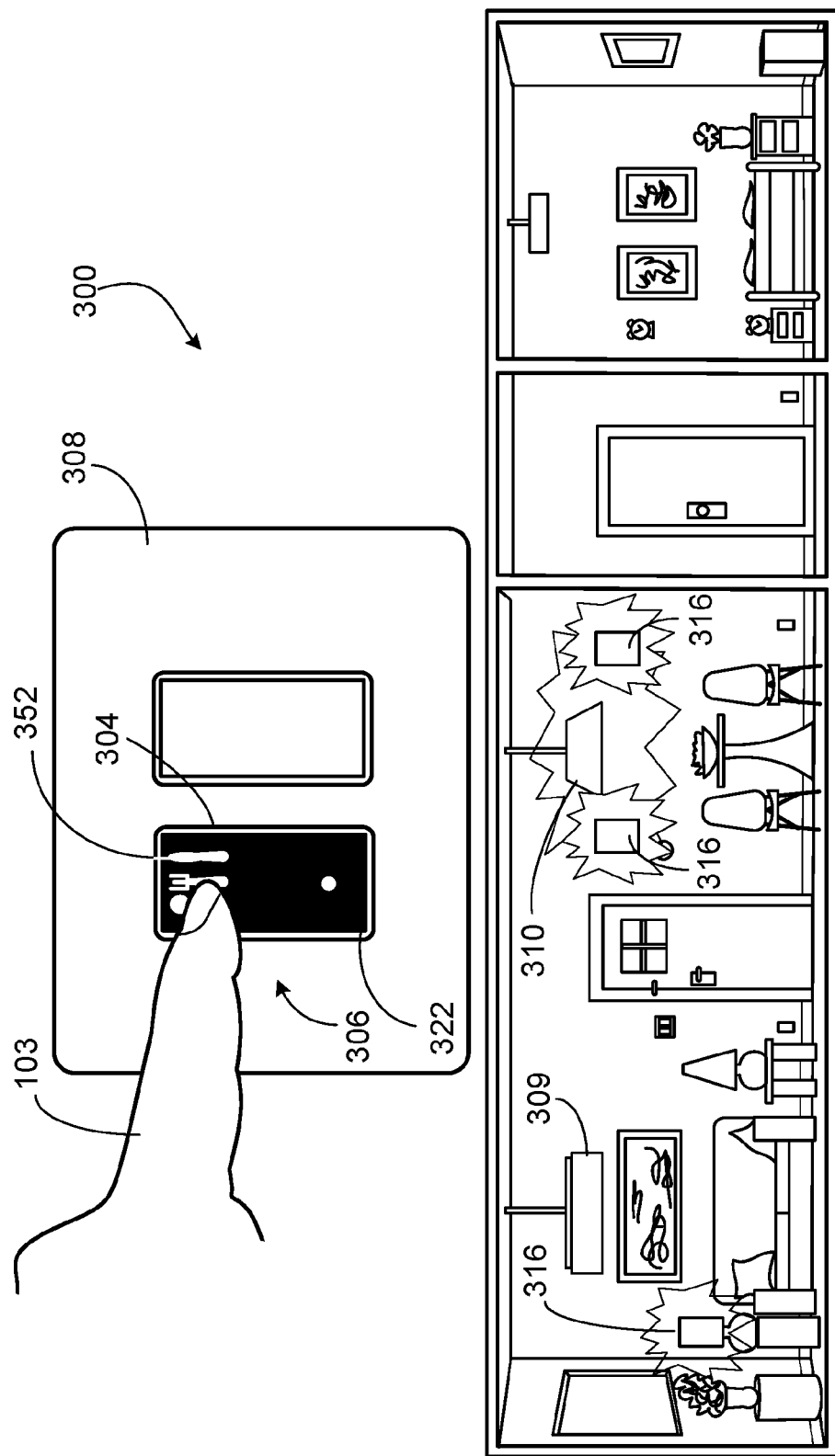

In FIG. 3A, the lighting control device 300 is connected to a base module positioned behind the wall-plate 308. The lighting control device 300 includes a dynamic light switch actuator 306, operable in a manner similar to the light switch actuator discussed in connection with FIGS. 1A-2C, and an auxiliary light switch actuator. As demonstrated in FIG. 3A by the unilluminated outer actuation surface 322 of the light switch actuator 306 is inactive and not energized. In response to a user 103 moving the actuation surface 322 of the light switch actuator 306, the light switch actuator 306 begins to become energized, as shown in FIG. 3B. The energization or activation of the light switch actuator 306 is signaled by the power light indicator 305 and by full lighting setting icon 351. As shown in FIG. 3C where the icon 351 is fully lit (rather than partially lit as in FIG. 3B), the light switch actuator 306 is fully energized. In this particular configuration, the primary lights 309 and 310 are illuminated at full power. FIG. 3D shows the transition between lighting settings. As demonstrated in FIG. 3D, this transition is facilitated via user 103 completing swiping gesture 312 across the tactile display 304 and along the actuation surface 322. As the user completes the gesture 312, the icon 351 is swiped from the tactile display 304 as the tactile display toggles to a new light setting shown in FIG. 3E. The new light setting shown in FIG. 3E is represented or identified by the dinner icon 352. The new light setting shown in FIG. 3E has the light fixture 309 powered down and has caused lamp 316 and sconces 318 to become illuminated to change the lighting scene in the room. The change in the light setting causes a change in distribution of power to certain lighting fixture based on the selected lighting setting. The light switch actuator 306 may be pre-programmed with a plurality of lighting settings or may be configured with particular lighting settings as specified by the user 103. A further swiping gesture 315 shown in FIG. 3F or a different gesture are used to transition from the lighting setting of FIG. 3F represented by icon 352 to a further lighting setting.

Figure 4:
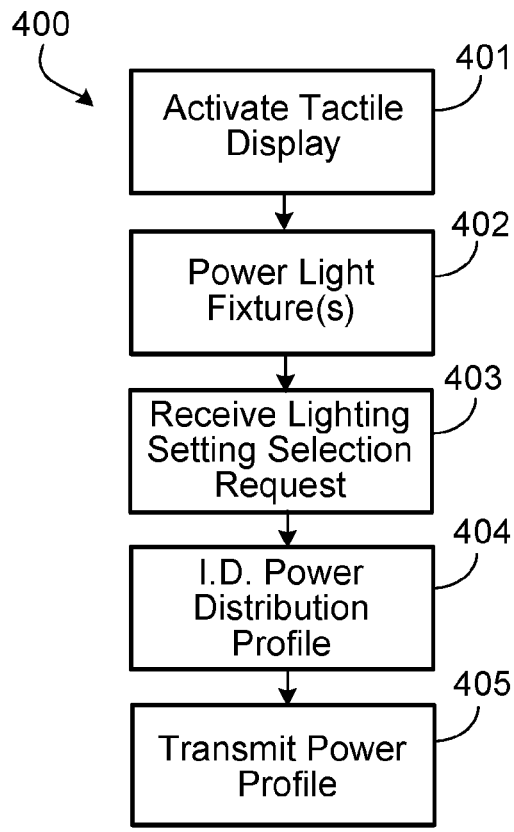
FIG. 4 provides a flow diagram of operations of a system for controlling a lighting control device.

FIG. 4 provides a flow diagram of operations of a system for controlling a lighting control device. FIG. 4 illustrates control operations of a control system, such as processor 130 configured to control the lighting control device 100 or 300, in accordance with various embodiments of the present invention. At 401, the tactile display housed in the light switch actuator is activated by moving the light switch actuator, for example by moving the actuation surface of the light switch actuator. At 402, the light fixtures electrically coupled to the light switch actuator via a base module are powered as the movement of the light switch actuator causes a contact component to move into a new position and thereby permit or cause an electrical flow path between a power source and the light fixture(s) to be closed. The tactile display housed in the light switch actuator is moved contemporaneously with the actuation surface. At 403, a lighting setting selection request is received via the tactile display, for example by a particular motion or motions on the tactile display. The lighting setting selection request identifies a lighting setting from among a plurality of lighting settings. A user may swipe multiple times to toggle through the plurality of lighting settings or may conduct a specific motion that corresponds to a particular lighting setting including, but not limited to, a half swipe and tap to achieve a light intensity of all the connected light fixtures at half of their peak output. The lighting settings identify distinct power distribution schemes for one or more light fixtures connected to the light switch module. At 404, a power distribution scheme is identified. At 405, the identified power distribution scheme is transmitted, for example by the base module responding to control signals from the light switch actuator, to adjust one, some, or all of the lights based on the power distribution scheme corresponding to the lighting setting selected. The power distribution schemes or profiles may be stored in a memory device of the lighting control device. In certain embodiments, the power distribution schemes may be adjusted to account for other parameters such as ambient lighting from natural light or an unconnected source. In certain embodiments the power distribution schemes may be adjusted based on one or more other sensor parameters. In particular embodiments, the lighting setting may be adjusted by automation based on time of day, sensed parameters such as light, temperature, noise, or activation of other devices including, but not limited to, any electronic device described herein.

Figure 5:
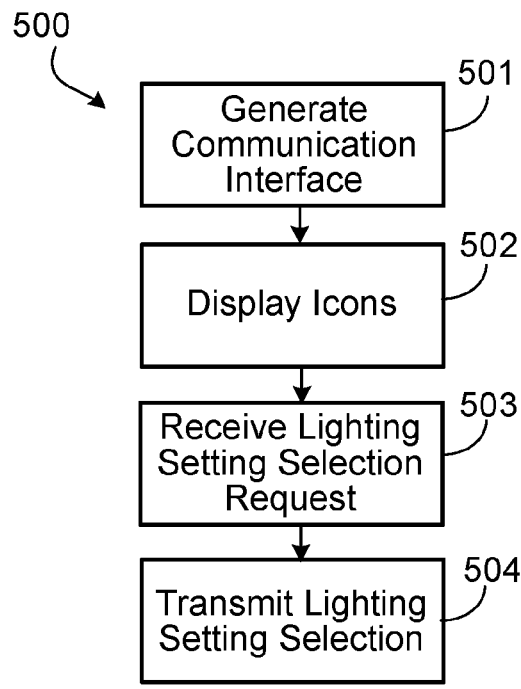
FIG. 5 shows a flow diagram of a system for remotely operating a lighting control device.

FIG. 5 shows a flow diagram of system for remotely operating a lighting control device. In particular embodiments, the lighting control device 100 or 300 may be operable from a remote device if the actuator switch is activated or energized. In such instances, the remote device may include one or more computer program applications, such as system 500, operating on the device to communicate with and control the lighting control device. Accordingly, at 501, the control system 500 initiates a connection module to generate a communication interface between a mobile electronic device and a light switch module. The connection module may cause the remote device to send one or more wireless transmission to the lighting control device via a communication protocol. At 502, the control system 500 causes the remote device to generate a display of icons on a display device of the mobile electronic device to facilitate selection of a lighting setting. At 503, the control system 500 receives a lighting setting selection based on the user selecting a particular icon. At 504, a transmission module causes the lighting setting selected to be transmitted to the lighting control device so that the light switch module and/or the base module can cause the power distribution scheme corresponding to the lighting setting to be transmitted to the lighting fixtures. The tactile display of the lighting control device may be updated in concert with receipt of the lighting setting to display the icon selected on the mobile electronic device and corresponding to the lighting setting selected on the tactile device.

Figure 6:
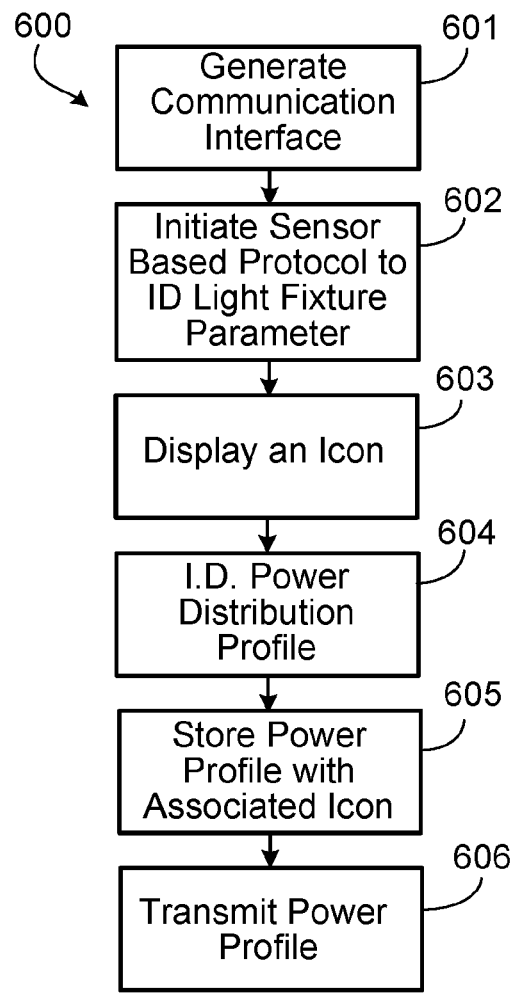
FIG. 6 illustrates a flow diagram of a system for remotely configuring operations of a lighting control device.

FIG. 6 illustrates a flow diagram of a system for remotely configuring operations of a lighting control device. The remote device may include devices including, but not limited to a mobile phone, a mobile computing device or a computing device remote from the light control device. At 601, the mobile electronic device generates a communication interface with the light switch module. At 602 a light fixture identification module initiates a sensor based protocol to identify a parameter associated with one or more light fixtures connected to the light switch control module. At 603, a display selection module causes a display of an icon to appear on a display device of the mobile electronic device. At 604, a lighting setting configuration module allows a user to create a power distribution scheme or profile for the light fixtures identified based on the identified parameters and a user specified input related to light intensity. At 604, a storage module is used to the store the power distribution scheme and associate a particular lighting setting icon with the power distribution scheme. At 605, a transmission module transmits the power distribution scheme and the associated icon to the light switch control module.

Figure 7:
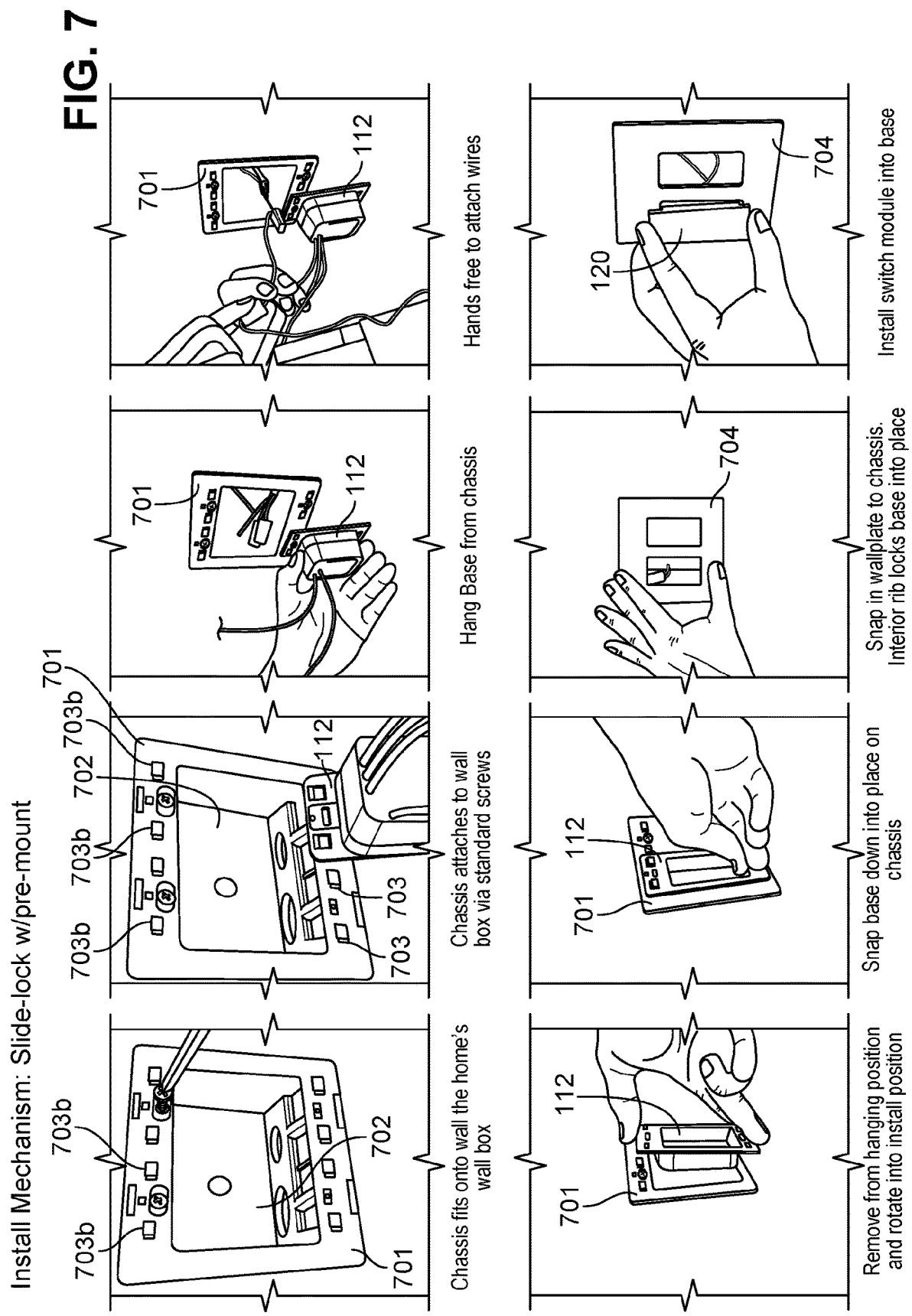
FIG. 7 shows a pre-mount chassis and procedure for installing lighting control system components with a pre-mount chassis.

FIG. 7 shows a pre-mount chassis and procedure for installing lighting control system components with a pre-mount chassis. To install the system a user mounts the chassis 701 to wall box 702 using screws, such as 6-32 screws. The chassis 701 fits to different types of wall boxes, including new construction wall boxes and old construction wall boxes and plastic and metal. The chassis 701 can be scaled to a plurality of gang box sizes, such as single, double, triple and quadruple gang boxes. The chassis 701 is compatible to fit different wall box screws and can also accommodate drywall screws. An installer hangs each base 112 module ("lighting control module") upon the bottom hooks 703 of the chassis 701. According to the orientation of the wires, left to right, the user connects each wire from the base module 112 to the corresponding wires in the wall box 702 of the home or building, for example with wire nuts. In certain embodiments, (given the availability of a neutral wire in the wall box 702), the user can gain access to an additional neutral wires, which can be concealed by a pull-away sticker (not shown) in the body of the base 112. Once all wires are connected and organized in the wall box 701, the user removes the base 112 from the bottom chassis hooks 703, rotates the base 112 into an upright position and presses the base 112 into the chassis' four hooks (two top 703b, two bottom 703). The base 112 is then slid downward into a locked position. A small protrusion in the chassis registers to a corresponding cavity ion the back of the base 112 mounting plate. The chassis 701 has a raised nub centered upon the wall-plate screw hole of the base module 112. The snap is not permanent—the slide-lock action may be assembled and removed repeatedly. The wall plate 704 is then affixed to the chassis with snap-fit mechanisms. Registration details are incorporated in the wall plate so that once it's installed it locks the Base into place. When the wall plate 704 is assembled, the base 112 cannot be removed without removing the wall plate first. The directions of the two snap in components, the base 112 to chassis 701 and the wall plate 704 to the chassis 701, are orthogonal to each other which reinforces a secure locked assembly.

Figure 8:
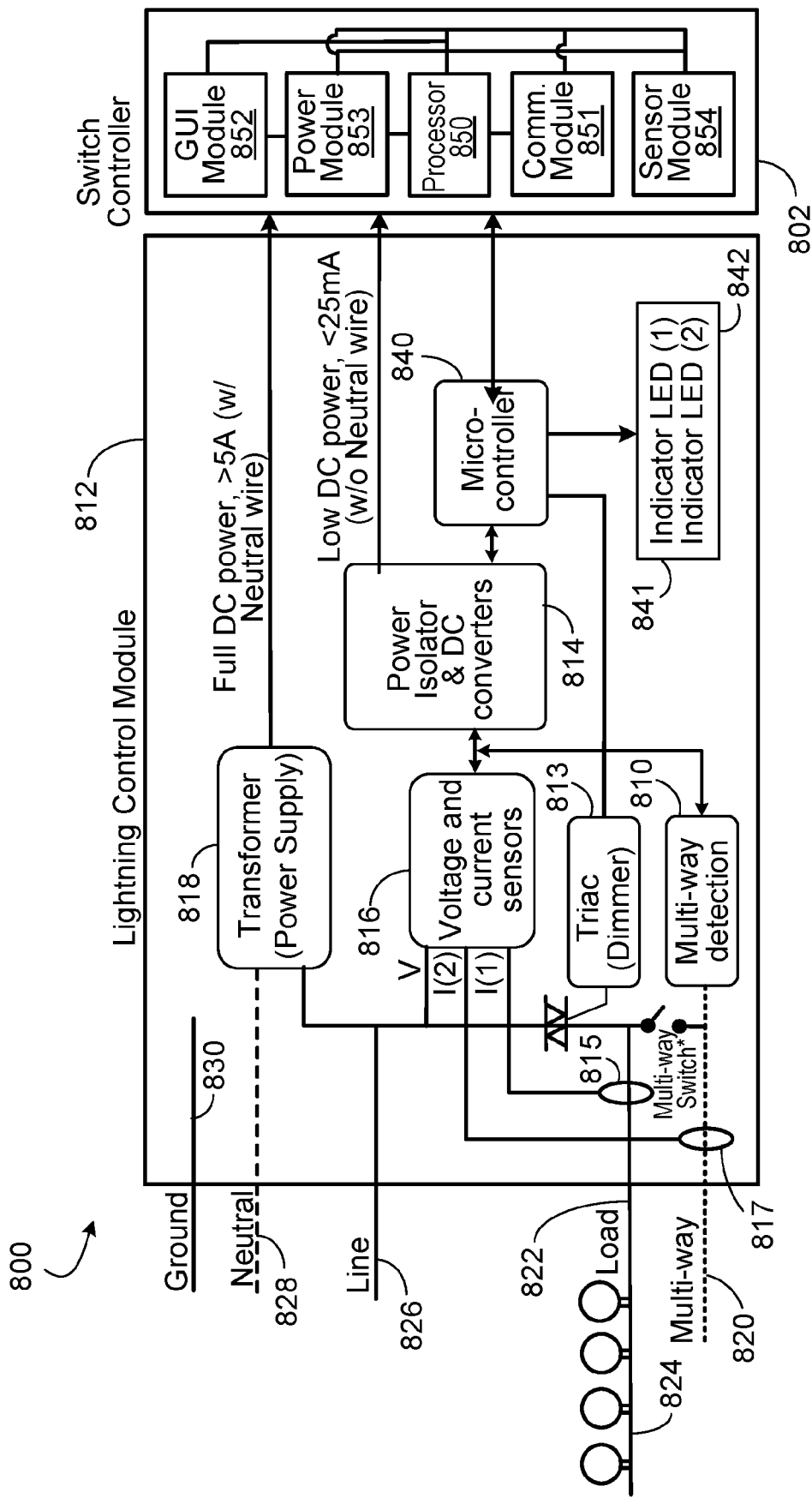
FIG. 8 is a schematic of a lighting control system.

FIG. 8 is a schematics of a lighting control system 800 configured to execute lighting control operations described herein. The lighting control system 800 illustrates lighting control system components that can be implemented with a lighting control system including an air gap system as described herein. The lighting control system 800 is depicted separated into a base lighting control module 812 (which may be configured in a manner similar to base module 112) and a switch module or switch controller 802 (which may be configured in a manner similar to switch module 102). As described herein, the switch module 802 can include a tactile interface, operable via the graphical user interface module 852, and a switch actuator, such as the tactile display 104 and the light switch actuator 106 described herein. The switch module 802 houses a processor 850, which may be configured to send commands to microcontroller 840 and receive inputs from the micro-controller 840 to control the operation of a transformer 818, a power isolator and an AC to DC converter 814 (which may include a flyback converter), and a dimmer, such as a TRIAC dimmer 813, a voltage and current sensor 816. In some embodiments, the base lighting control module 812 may include a MOSFET dimmer. The power isolator 814 separates the analog AC current from the low power or DC digital components in the base lighting control module 812 and the switch module 802. The power isolate 814 may provide power inputs to the switch control module 802 via a power module 853. Power module 853 includes power circuitry configured to regulate the flow of power from the base module 812 to the switch controller module 802 including directing power to one or more of the modules in the switch controller module 802. The switch module 802 also houses a communication module, which can include one or more antennae or other wireless communication modules. The switch module 802 also houses a sensor module, which can include one or more sensors, such as a light sensor, a camera, a microphone, a thermometer, a humidity sensor, and an air quality sensor.

The processor 850, is communicably coupled with one or more modules in the switch module 802 to control the operation of and receive inputs from those modules, for example to control modulation of the flow of electrical energy to a lighting circuit of a light fixture 824 connected to the base lighting control module 812.

The base lighting control module 812 includes a ground terminal 830 for grounding various electrical components container in the module 812. The base light control module 812 includes a neutral terminal 828 for connecting to a neutral wire, a line terminal 826, and a load terminal 822. As shown in FIG. 8, the voltage and current sensor(s) are coupled to the load line to detect changes in the voltage or current along the line carrying power to one or more light fixtures 824 connected to the lighting circuit (750). The base lighting control module 812 also includes a controller 840 communicably coupled to the processor 850. The base lighting control module 812 also includes LED indicator lights 842 and 841 for indicating information regarding the status of the base lighting control module 812. For example, in some embodiments LED indicator light 841 can indicates if a neutral wire is connected while LED indicator light 842 can indicate if a 3 way connection is connected.

Implementations of the subject matter and the operations described in this specification can be implemented by digital electronic circuitry, or via computer software, firmware, or hardware, including the structures disclosed in this specification and their structural equivalents, or in combinations of one or more of them. Implementations of the subject matter described in this specification can be implemented as one or more computer programs, i.e., one or more modules of computer program instructions, encoded on computer storage medium for execution by, or to control the operation of, data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Implementations of the subject matter described in this specification can be implemented in a computing system that includes a back end component, e.g., as a data server, or that includes a middleware component, e.g., an application server, or that includes a front end component, e.g., a user computer having a graphical display or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some implementations, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

For the purpose of this disclosure, the term "coupled" means the joining of two members directly or indirectly to one another. Such joining may be stationary or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It should be noted that the orientation of various elements may differ according to other exemplary implementations, and that such variations are intended to be encompassed by the present disclosure. It is recognized that features of the disclosed implementations can be incorporated into other disclosed implementations.

While various inventive implementations have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive implementations described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive implementations described herein. It is, therefore, to be understood that the foregoing implementations are presented by way of example only and that, within the scope of the appended claims and equivalents thereto, inventive implementations may be practiced otherwise than as specifically described and claimed. Inventive implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which at least one example has been provided. The acts performed as part of the method may be ordered in any suitable way. Accordingly, implementations may be constructed in which acts are performed in an order different than illustrated, which may include performing some acts simultaneously, even though shown as sequential acts in illustrative implementations.

The implementations described herein should not be read as limited to the described order or elements unless stated to that effect. It should be understood that various changes in form and detail may be made by one of ordinary skill in the art without departing from the spirit and scope of the invention. All implementations that come within the spirit and scope of the present disclosure and equivalents thereto are claimed.

What is claimed is:

1. A method of installing a lighting control system comprising:
    attaching a chassis to an electrical wall box, the chassis including a hook and an opening, the hook positioned along a peripheral portion of the opening;
    hanging a base module from the hook in the chassis, the base module including:
        a base housing forming a well,
        a first electrical connector positioned in the well and configured to electrically couple to an alternating current (A.C.) power supply and electrically coupled to a lighting circuit of a light fixture;
    coupling a plurality of base module wires extending from the base module to a plurality of electrical wall box wires extending from the electrical wall box contemporaneously with the base module hanging from the hook, wherein the wires are configured to connect the A.C. power supply to the base module
    removing the base module from the hook after connecting the plurality of base module wires to the plurality of electrical wall box wires; and
    nesting the base module into the electrical wall box such that the well extends through the opening in the chassis and into the electrical wall box, wherein nesting further includes engaging an opening in the base module with the hook.

2. The method according to claim 1, wherein hanging the base module from the hook further comprises hanging the base module below the opening of the chassis.

3. The method according to claim 1, wherein the hook creates a vertical slot for a slide-lock engagement with the hanging base module.

4. The method according to claim 1, wherein hanging the base module further comprises hanging the base module from a pair of hooks.

5. The method according to claim 4, wherein the base module comprises at least four openings and the chassis comprises at least four hooks and wherein the base module is configured to hang from two of the openings positioned at a top portion of the chassis engaging two of the hooks positioned at a bottom portion of the chassis.

6. The method according to claim 1, wherein attaching further comprises attaching the chassis to the electrical wall box via screws.

7. The method according to claim 1, further comprising:
    nesting the base module into the wall box such that the well extends through the opening of the chassis into the electrical wall box and the opening in the base module engages the hook.

8. The method according to claim 7, wherein the hook is configured for snap fit engagement with the opening of the base module when nested.

9. The method according to claim 1, wherein engaging the opening of the base module with the hook occurs without a screw fastener.

10. The method according to claim 1, further comprising attaching a wall plate to the chassis over the base module.

11. The method according to claim 10, further comprising nesting a light control module in the base module, wherein the light control module is configured to modulate a flow of electrical energy to the lighting circuit and includes a second electrical connector configured for engagement with and electrical coupling to the first electrical connector of a base module when nested.

12. A method according to any one of the preceding claims wherein the chassis is one of a single, double, triple and quadruple gang box size.

13. The method according to claim 9, wherein the chassis is configured to hold a plurality of nested base modules in parallel with one another.

* * * * *